Figure 1:
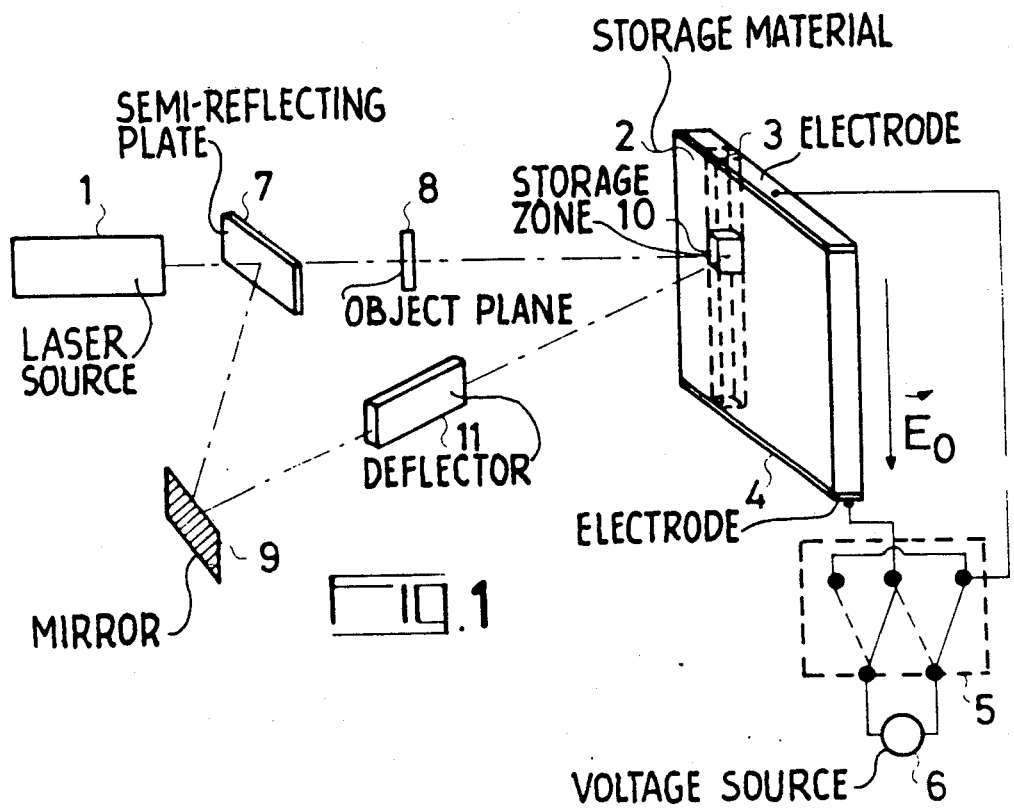

United States Patent [19]

Micheron et al.

[11] 4,124,268
[45] Nov. 7, 1978

[54] OPTICAL DEVICE FOR THE STORAGE AND THE SELECTIVE ERASURE OF INFORMATION

[75] Inventors: Francois Micheron; Jean Pierre Huignard, both of Paris, France

[73] Assignee: Thomson-CSF, Paris, France

[21] Appl. No.: 704,979

[22] Filed: Jul. 13, 1976

[30] Foreign Application Priority Data

Jul. 17, 1975 [FR] France ................ 75 22354

[51] Int. Cl.² .......................................... G02B 27/00
[52] U.S. Cl. .................................. 350/3.63; 350/150; 365/109; 365/216
[58] Field of Search ............... 350/3.5, 150; 365/215, 365/216, 109, 112

[56] References Cited

U.S. PATENT DOCUMENTS

| 3,652,145 | 3/1972 | Thaxter .................. 350/3.5 |
| 3,782,802 | 1/1974 | Micheron et al. ........... 350/3.5 |
| 3,847,465 | 11/1974 | Micheron et al. .......... 350/3.5 |
| 3,892,465 | 7/1975 | Micheron et al. .......... 350/3.5 |

OTHER PUBLICATIONS

Keneman et al, *Applied Physics Letters,* vol. 17, No. 4, Aug. 15, 1970, pp. 173–175.
Micheron et al, *Applied Physics Letters,* vol. 20, No. 2, Jan. 15, 1972, pp. 79–81.
Tseng et al, *IBM Tech. Discl. Bulletin,* vol. 15, No. 4, Sep., 1972, pp. 1327–1328.
Micheron et al, *Applied Optics,* vol. 13, No. 4, Apr. 1974, pp. 784–787.

*Primary Examiner*—John K. Corbin
*Assistant Examiner*—John D. Lee
*Attorney, Agent, or Firm*—Cushman, Darby & Cushman

[57] ABSTRACT

The object of the invention is to provide a device for storing and selectively erasing information in electro-optical photoconductive materials in which selective recording and erasure are obtained by identical optical devices which project the same distribution of light onto the zone to be recorded and then erased. Recording and erasure differ solely in the direction of the electrical field applied to the material.

4 Claims, 2 Drawing Figures

OPTICAL DEVICE FOR THE STORAGE AND THE SELECTIVE ERASURE OF INFORMATION

This invention relates to optical devices, for storing and selectively erasing information, using a high-density holographic recording. In optical storage devices based on the volume hologram principle, it is possible to reach a very high information storage density by utilizing BRAGG's angular selectivity effect which enables a large number of individual holograms to be superposed in one and the same zone of the storage material.

In order, when erasing a zone, to avoid having to rewrite all the information which does not have to be erased, it is necessary to erase the required zone only. A known selective erasing technique consists in recording index variations complementary to those to be erased by means of an illuminating signal phase-shifted in relation to the first, the initially dark zones then being illuminated whilst the initially illuminated zones are dark.

This technique necessitates the inclusion, in the path of one of the object or reference beams of the optical storage device, of an electro-optical modulator capable of transmitting this beam without any phase shift during recording and with a phase shift of $\pi$ during erasure.

The present invention relates to a more simple optical storage and selective erasure device which may be used with electro-optical, photoconductive storage materials having a symmetrical electro-optical characteristic.

According to the present invention, there is provided an optical device for the storage and the selective erasure of information in a photoconductive electro-optical storage material, said material having a symmetrical electro-optical characteristic, comprising:

optical means which, for the storage, ensure the photoexcitation of a zone of said material by a network of interference fringes, said photoexcitation photoinducing an elementary hologram in said zone, for the read-out of said elementary hologram provide the illumination of said zone by a beam of monochromatic light and for the selective erasure of said elementary hologram ensure the photoexcitation of said zone by the same network; and polarizing means for applying a first electrical field within said material during said storage and a second electrical field during said erasure of the same zone, said second electrical field being opposite to said first electrical field.

Figure 2:
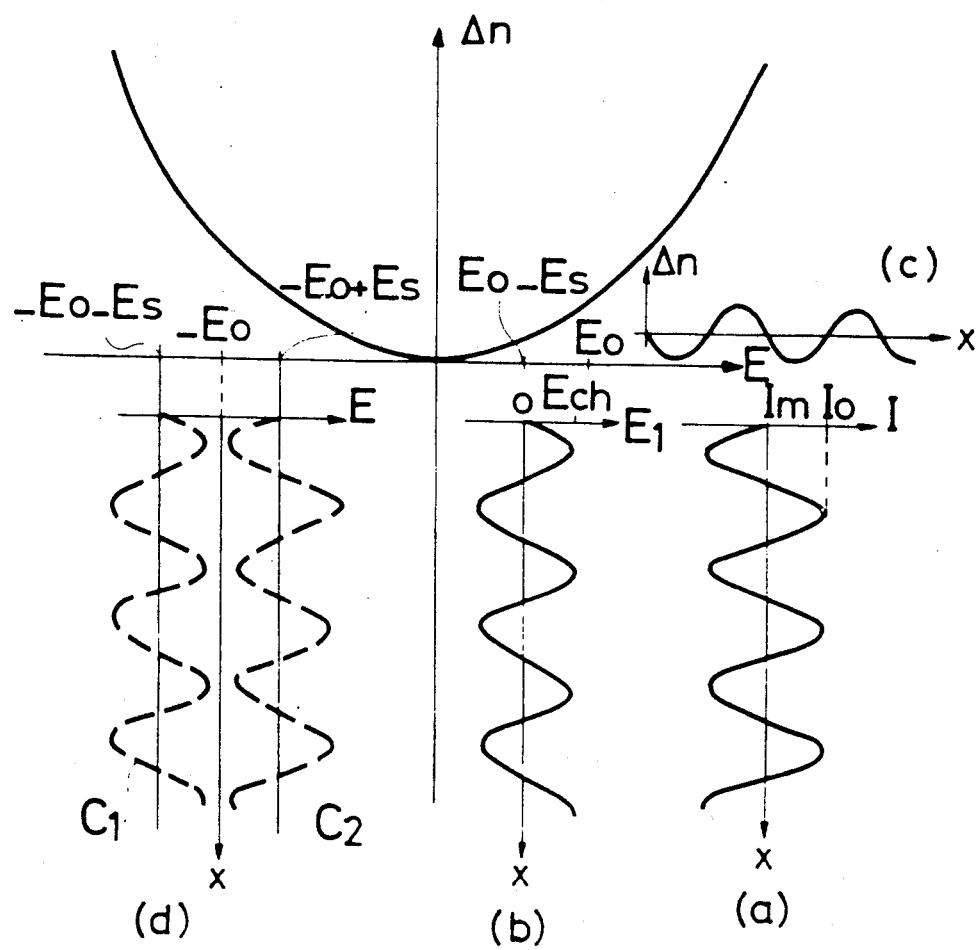

For a better understanding of the invention and to show how the same may be carried into effect, reference will be made to the following description and the attached drawings among which:

FIG. 1 diagrammatically illustrated an optical system according to the invention;

FIG. 2 shows curves explaining the operation of the optical system according to the invention.

FIG. 1 shows a laser source 1 emitting a beam, of which only the optical axis is shown, and a plate 2 of electro-optical photoconductive storage material with a symmetrical electro-optical characteristic or birefraction induced in dependence upon the electrical field. This storage material 2 is capable of being polarized by means of two electrodes 3 and 4 connected to the two terminals of a two-position switch 5, an external voltage source 6 being connected to the input terminals of the switch. The two positions are shown in the drawing in solid lines and in dotted lines, respectively, the first position corresponding to a field developed in the material designated $+\vec{E}_o$ and the second corresponding to a field designated $-\vec{E}_o$.

The beam emitted by the laser source 1 is divided into an object beam and a reference beam by a semi-reflecting plate 7, the object beam illuminating the object plane 8.

The reference beam is reflected by a mirror 9 and then directed towards the storage zone 10 by means of a deflector 11. The object and reference beams interfere in the storage zone 10 and create a spatial distribution of light which is assumed to be sinusoidal for the purposes of the following explanation.

Since the material used for the holographic recording is electro-optical, a field $\vec{E}$ developed at the terminals of the material produces an index variation $\Delta n$ of this material.

The characteristic linking the index variation $\Delta n$ with the field $\vec{E}$ varies with the materials.

The materials suitable for use in accordance with the invention have a symmetrical electro-optical characteristic, two opposite fields $+\vec{E}_o$ and $-\vec{E}_o$ producing index variations of the same amplitude and the same direction.

By way of example, a quadratic characteristic is shown in FIG. 2.

In addition, the material is photoconductive. In other words, under the effect of a spatial distribution of light such as shown at (a) in FIG. 2: $I = I_m - I_o \sin k x$, $I_m$ being the mean light received by the zone and $I_o$ the amplitude of the variation in illumination, a spatial variation of the space charge field $\vec{E}_1 = \vec{E}_{ch} \sin k x$ is induced in the material about a mean field value $\vec{E}_o - \vec{E}_s$ which is governed by the outer field $\vec{E}_o$ applied to the material and by a field $\vec{E}_s$ which is assumed to be attributable to the edge effect of the illuminated zone, $\vec{E}_s$ tending to be opposed to the applied field $\vec{E}_o$. The spatial variation of the space charge field is such that, in the illuminated zones it tends to be opposed to the applied field as shown by the curves (a) and (b) in FIG. 2.

Accordingly, this field distribution creates by an electro-optical effect a spatial index variation in the material as illustrated by the curve (c).

Experience has shown that, by reversing the direction of the external field $\vec{E}_o$ applied to the material by means of the switch 5 and by illuminating the zone to be erased by the same network as that used for storing, the index variation induced during the first recording is eliminated.

This phenomenon may be explained as follows: when the applied field is reversed by means of the switch 5, the variation in the space charge field is transported about the value $-\vec{E}_o - \vec{E}_s$. This is illustrated by the curve $C_1$ of diagram (d) in FIG. 2.

If, irrespective of this first recording, the material is subjected under field $-\vec{E}_o$ to the same spatial variation in illumination as for the first recording, a spatial variation in the space charge field is induced with the same amplitude $\vec{E}_{ch}$, providing the power of the source and the exposure time are the same, about a value $-\vec{E}_o + \vec{E}_s$, because the field attributable to the edge effect is directed oppositely to the applied field. The charge field created in the illuminated zones which tends to oppose the field $-\vec{E}_o$ is less negative than the field created in the dark zones. This space charge field is represented by the curve $C_2$ of diagram d. Globally, the first recording made about the value $-\vec{E}_o - \vec{E}_s$ is:

$$-\vec{E}_o - \vec{E}_s + \vec{E}_{ch} \sin k x \qquad (1)$$

The second recording superimposed upon the first creates a field $\vec{E_s}$ which compensates the term $-\vec{E_s}$ of expression (1) and a space charge field $-\vec{E_{ch}} \sin k x$ which compensates the term $\vec{E_{ch}} \sin k x$. Thus, if the distribution of light, the exposure time and the power of the source are the same during recording under field $\vec{E_o}$ and during erasure under field $-\vec{E_o}$, the first field distribution is compensated by the second and the field is constant and equal to $-\vec{E_o}$ at the end of these two operations, the index variation induced by the first storage is thus cancelled by the second. After elimination of the field in the material, the index reassumes its initial value.

The materials which may be used for forming the storage material may be non-polar ferroelectric PLZT ceramics, of which the characteristic is quadratic, or materials such as SBN and KTN which also have quadratic characteristics for certain compositions.

It is also possible to use photoconductive films associated with electro-optical materials of the KDP type. Unlike the devices based on the index variation induced by internal photo-excitation of electrons, these devices can only be two-dimensional. On the other hand, the independance of the various qualities (electro-optical and photoconductive) provides for a wider choice of materials.

The erasure which is produced by simple switching of the field makes it possible to eliminate the lack of precision encountered in selective erasure devices during determination of the phase shift of $\pi$ of one of the beams.

The invention is not limited to the embodiment described and illustrated. In particular, materials having both a symmetrical electro-optical characteristic and photoconductive properties may be used for forming the storage material.

What we claim is:

1. An optical device for the storage and the selective erasure of information comprising:
    a photoconductive electro-optical storage material, said material having a symmetrical electrooptical characteristic;
    optical means which, for the storage, ensure the photoexcitation of a zone of said material by a network of interference fringes, said photoexcitation photoinducing an elementary hologram in said zone for the read-out of said elementary hologram, provide the illumination of said zone by a beam of monochromatic light and for the selective erasure of said elementary hologram, ensure the photoexcitation of said zone by the same network; and
    polarizing means for applying a first electrical field within said material during said storage and a second electrical field during said erasure of the same zone, said second electrical field being opposite to said first electrical field, said fields being orthogonal to said interference fringes.

2. An optical device for the storage and the selective erasure as claimed in claim 1, wherein said polarizing means comprise at least two electrodes arranged on said material, a voltage source connected to said electrodes and means connected between said electrodes and said voltage source for reversing the direction of the electrical field applied to said material.

3. An optical device for the storage and the selective erasure of information as claimed in claim 2, wherein said storage material is formed by a non-polar ferroelectric plate having a quadratic electro-optical characteristic.

4. An optical device for the storage and the selective erasure of information as claimed in claim 2, wherein said storage material is formed by a plate of electro-optical material associated with a photoconductive element.